United States Patent
Khoueir et al.

(10) Patent No.: US 9,910,606 B2
(45) Date of Patent: Mar. 6, 2018

(54) END OF LIFE EXTENSION OF SOLID STATE MEMORY

(71) Applicant: Seagate Technology LLC, Cupertino, CA (US)

(72) Inventors: Antoine Khoueir, Apple Valley, CA (US); Ara Patapoutian, Hopkinton, MA (US); David S. Ebsen, Minnetonka, MN (US); Ryan J. Goss, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 6 days.

(21) Appl. No.: 15/078,151

(22) Filed: Mar. 23, 2016

(65) Prior Publication Data

US 2017/0277448 A1    Sep. 28, 2017

(51) Int. Cl.
    G11C 29/00    (2006.01)
    G06F 3/06     (2006.01)
    G06F 11/10    (2006.01)
    G11C 29/52    (2006.01)

(52) U.S. Cl.
    CPC .......... G06F 3/0616 (2013.01); G06F 3/0649 (2013.01); G06F 3/0653 (2013.01); G06F 3/0679 (2013.01); G06F 11/1068 (2013.01); G11C 29/52 (2013.01)

(58) Field of Classification Search
    None
    See application file for complete search history.

(56) References Cited

U.S. PATENT DOCUMENTS

| 6,829,554 | B2 | 12/2004 | Dueregger et al. |
| 7,168,010 | B2 | 1/2007 | Yadavalli et al. |
| 7,493,534 | B2 | 2/2009 | Pomaranski et al. |
| 8,091,000 | B2 | 1/2012 | Chang et al. |
| 8,503,238 | B1 | 8/2013 | Wu et al. |
| 8,898,548 | B1 * | 11/2014 | Mullendore ........ G06F 11/1048 365/185.09 |
| 9,229,805 | B2 | 1/2016 | Yim et al. |
| 2005/0050410 | A1 | 3/2005 | Pomaranski et al. |
| 2011/0302477 | A1 * | 12/2011 | Goss .................. G06F 11/1068 714/773 |
| 2012/0036312 | A1 * | 2/2012 | Feldman ............. G06F 12/0246 711/103 |

(Continued)

Primary Examiner — Daniel McMahon
(74) Attorney, Agent, or Firm — Hall Estill Attorneys at Law (57) ABSTRACT

Method and apparatus for managing a solid state memory, such as but not limited to a NAND flash memory. In some embodiments, a storage device includes a non-volatile solid state memory and a control circuit configured to transfer user data between the memory and a host device. The control circuit maintains, in a local memory, a data structure indicative of measured readback error rates associated with memory locations in the memory in relation to erasure counts associated with the memory locations. The control circuit retires a subset of the memory locations identified by the data structure from further availability to store user data from the host device responsive to the measured readback error rates, and responsive to the erasure counts of said memory locations indicating the memory has reached an end of life (EOL) condition.

20 Claims, 6 Drawing Sheets

(56) References Cited

U.S. PATENT DOCUMENTS

| | | | |
|---|---|---|---|
| 2013/0326115 A1* | 12/2013 | Goss | G06F 3/0641 |
| | | | 711/103 |
| 2014/0157078 A1* | 6/2014 | Danilak | H03M 13/09 |
| | | | 714/758 |
| 2014/0201437 A1* | 7/2014 | Endres | G06F 3/0653 |
| | | | 711/112 |
| 2014/0244912 A1 | 8/2014 | Birk et al. | |
| 2015/0143054 A1 | 5/2015 | Ackaret et al. | |
| 2015/0149818 A1 | 5/2015 | Kalvade et al. | |
| 2015/0154061 A1 | 6/2015 | Camp et al. | |
| 2015/0161035 A1 | 6/2015 | Fisher et al. | |

* cited by examiner

HISTORY TABLE

154

| ADDRESS | PE COUNT | BER | HARD ERRORS | OUTER CODE RECOVERY | ADJACENT READ COUNT |
|---------|----------|------|-------------|---------------------|---------------------|
| PA1 | PE1 | BER1 | HE1 | OCR1 | ARC1 |
| PA2 | PE2 | BER2 | HE2 | OCR2 | ARC2 |
| PA3 | PE3 | BER3 | HE3 | OCR3 | ARC3 |
| ... | ... | ... | ... | ... | ... |

FIG. 6

EXCEPTION LIST

156

| ADDRESS | BER | HARD ERRORS | OUTER CODE RECOVERY |
|---------|------|-------------|---------------------|
| PA1 | BER1 | HE1 | OCR1 |
| PA2 | BER2 | HE2 | OCR2 |
| PA3 | BER3 | HE3 | OCR3 |
| ... | ... | ... | ... |

END OF LIFE EXTENSION OF SOLID STATE MEMORY

SUMMARY

Various embodiments of the present disclosure are generally directed to a method and apparatus for managing a solid state memory, such as but not limited to a NAND flash memory.

In some embodiments, a storage device includes a non-volatile solid state memory and a control circuit configured to transfer user data between the memory and a host device. The control circuit maintains, in a local memory, a data structure indicative of measured readback error rates associated with memory locations in the memory in relation to erasure counts associated with the memory locations. The control circuit retires a subset of the memory locations identified by the data structure from further availability to store user data from the host device responsive to the measured readback error rates, and responsive to the erasure counts of said memory locations indicating the memory has reached an end of life (EOL) condition.

In other embodiments, a solid-state drive (SSD) has a NAND flash memory array comprising non-volatile flash memory cells arranged into erasure blocks, each erasure block having a plurality of pages for storage of user data. A read/write/erase (R/W/E) circuit is configured to respectively program data to the pages during a write operation, read previously programmed data from the pages during a read operation, and erase the erasure blocks during an erasure operation. The SSD further has a local volatile memory and a control circuit. The control circuit is configured to maintain, in the local memory, an exception list data structure comprising readback error rates associated with a subset of the pages in the memory that exhibit degraded read performance during said read operations, the control circuit retiring selected ones of the pages listed in the exception list data structure from further availability to store user data from the host device responsive to the measured readback error rates and associated erasure counts for the selected ones of the pages indicating a total number of erasure operations exceeding a specified end of life (EOL) condition for the memory.

In further embodiments, a method includes steps of storing user data to, and retrieving user data from, memory locations of a non-volatile solid-state memory; populating an exception list data structure in a local memory comprising a plurality of entries, each entry corresponding to a different one of the memory locations and comprising a measured read error rate for the associated memory location; monitoring an erasure count as a total number of erase operations applied to a selected memory location; and retiring a first portion of the memory locations in the exception list from further availability to store user data responsive to the erasure count reaching an end of life (EOL) specification for the memory.

DETAILED DESCRIPTION

The present disclosure is generally directed to data storage systems, and more particularly to extending an operational life of a solid state memory such as a NAND flash memory in a solid state drive (SSD).

Data storage devices operate to store and retrieve user data in a fast and efficient manner. Some devices, such as solid state drives (SSDs), use solid state semiconductor memory cells to provide non-volatile data storage. Semiconductor memory can provide high sustained data transfer rates between a data storage device and a host.

Factors such as wear can limit the ultimate useful life of the devices. For example, some erasable NAND flash memories operated in a multi-level cell (MLC) configuration can achieve a specified end of life (EOL) condition after a few thousand program/erase (PE) cycles. It is desirable to manage a semiconductor memory to extend the operational life of the memory while ensuring that data stored by the memory can continue to be reliably retrieved when needed.

Various embodiments of the present disclosure are generally directed to memory management in a semiconductor memory. As explained below, various embodiments include a solid state non-volatile memory (NVM), and a control circuit configured to transfer user data between the NVM and a host device.

The control circuit maintains, in a local memory, a data structure indicative of measured readback error rates associated with memory locations in the NVM (hereinafter also referred to as "the memory") in relation to erasure counts associated with the memory locations. The control circuit operates to retire memory locations from further availability to store user data from the host device responsive to the measured readback error rates and the erasure counts of the memory locations.

As explained in detail below, the control circuit directs retirement of sections of the memory at the same granularity of read/write operations, such as at the page level in a NAND flash memory. A sophisticated algorithm tracks various parameters including read errors for different locations (e.g., pages).

An exception list data structure is formulated and populated with history data to track various parameters, such as read error performance for various locations. The exception list acts like a filter over time to accumulate the worst performing locations. The criteria to get added to the list can vary depending on the application, but generally, it is relatively easy to get added to the list and relatively more difficult to be removed from the list. Criteria can include persistent read errors or particularly difficult "hard" errors that require outercode (e.g., higher levels of ECC) or other mechanisms to resolve a given read error.

Some manageable total number of entries N is used for the list, such as 4096 entries, etc. The size of the list can be tailored to the size of the memory, and can get larger over time as the memory approaches end of life (EOL) specifications. The ultimate goal is to identify, over time, particularly troublesome locations (e.g., pages) that experience a statistically significant greater amount of read errors as compared to other locations. Since wear leveling and other techniques are used to distribute the writes and reads, statistically detectable variations should be present as the memory ages and approaches EOL.

At such times that the list is filled, certain processing takes place such as by sorting the entries by frequency and/or severity of the recovery efforts. Some portion of the list (the "best operating pages") are immediately released (removed from the list) and returned to normal operation. In some cases, locations added to the list may be temporarily restricted from further usage, or may continue to be used with performance updated responsive to the most recent read performance experienced for those locations. The system can therefore utilize two data structures: an overall history table for all memory locations, and the exception list to which candidates are promoted from the history table.

An advantage of this scheme is that pages that "behave badly" might be rehabilitated over time and be removed from the list and introduced back into normal circulation. For example, issues not relating to the actual state of the memory location, such as adjacent read/writes, read drift, etc. might not actually be due to wear of the memory itself but instead the increased error rates may be due to operational factors, temperature, etc. The system thus provides a slow moving filter that, over time, methodically identifies based on empirical history data which memory locations produce a statistically significant higher rate of errors on a consistent basis.

Another aspect of at least some embodiments is a background monitoring of program/erase (PE) counts, which indicates aging of the memory. It is expected that, generally, a given semiconductor memory will tend to wear out and exhibit increased numbers of read errors as the memory approaches the specified operational life.

Accordingly, while failing locations can be retired early in the life of the memory, the history data are maintained such that, as the memory reaches EOL, the adaptive self-selection process will indicate which memory locations have historically underperformed. Once EOL is reached, the worst performing locations can be removed from service, thereby promoting enhanced memory performance beyond the EOL point at an acceptable read error rate. This allows a user to extend the life of the memory and reduce the likelihood that a truly worn out memory location will continue to be used.

While separate history table and exception lists are contemplated, in other embodiments, an overall history table is not utilized. Rather, as memory locations (e.g., pages) are flagged as exhibiting worse than normal behavior, entries are generated for the exception list directly and it is presumed that those entries not flagged to the exception list exhibit acceptable performance.

Figure 1:
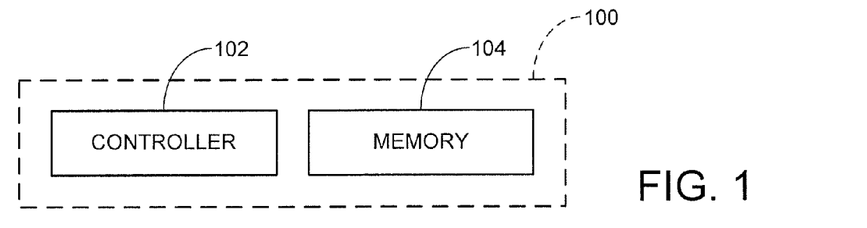
FIG. 1 is a functional block diagram of a data storage device in accordance with some embodiments.

These and other features and advantages of various embodiments can be understood beginning with a review of FIG. 1 which provides a functional block representation of a data storage device 100 of the type configured to store and retrieve user data from a host (not shown). The device 100 includes a top level controller 102 (also referred to as a controller circuit or a control circuit), and a memory module 104.

In some embodiments, the controller 102 is a hardware processor circuit or, alternatively, a programmable processor circuit that utilizes programming instructions stored in a memory. The controller 102 generally operates to provide top level control for the storage device. The memory module 104 incorporates solid state memory cells to provide a non-volatile memory (NVM) for storage of user data and may incorporate various read, write and/or erase circuits to control the transfer of data. In some embodiments, the controller functions may be incorporated directly into the memory module.

Figure 2:
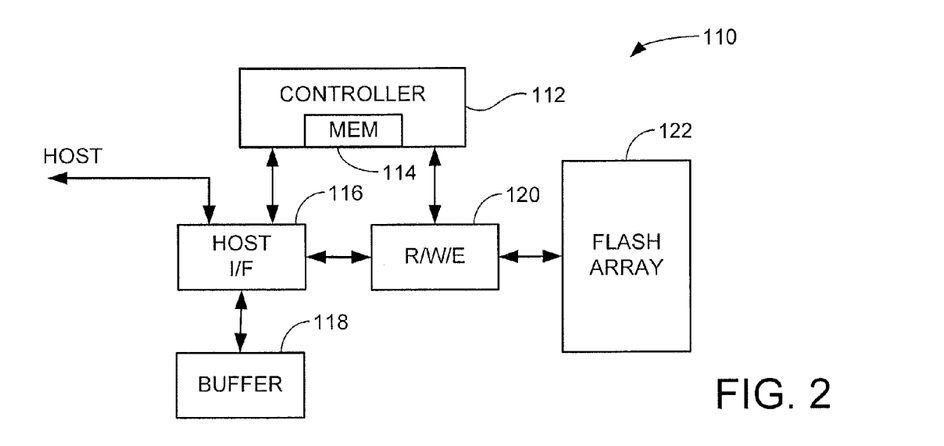
FIG. 2 is a functional block diagram of the data storage device of FIG. 1 characterized as a solid state drive (SSD) having NAND flash memory as a main memory store in accordance with some embodiments.

FIG. 2 shows a data storage device 110 similar to the device 100 of FIG. 1. The device 110 is characterized as a solid state drive (SSD) that utilizes NAND flash memory to provide the main storage of user data. Other forms of solid state semiconductor memory can be used as desired, such as but not limited to NOR flash memory, electrically erasable programmable read only memory (EEPROM), spin-torque transfer random access memory (STRAM), resistive random access memory (RRAM), phase change random access memory (PCRAM), magnetic random access memory MRAM), and so on. Devices that utilize rotatable storage (e.g., magnetic recording discs) and hybrid devices that utilize multiple forms of memory are also contemplated.

A controller 112 is arranged to operate in a manner that is similar to the controller 102 from FIG. 1 and may be a hardware based or programmable processor. Local memory (MEM) 114 provides local memory storage for parameters, control data and as required, programming instructions for use by the controller 112.

A host interface (I/F) circuit 116 processes access command communications with a host device. A local buffer memory 118 provides a temporary storage location for data being transferred between the host and the device 110.

A read/write/erase (R/W/E) circuit 120 applies necessary data signal processing to prepare input write data and to decode output readback data transferred between the buffer 118 and a flash memory array 122. The flash memory array is a non-volatile memory (NVM) made up of a collection of individual NAND flash memory cells each of which store data in the form of accumulated charge on a floating gate structure of a MOSFET-type memory cell (metal oxide semiconductor field effect transistor).

Figure 3:
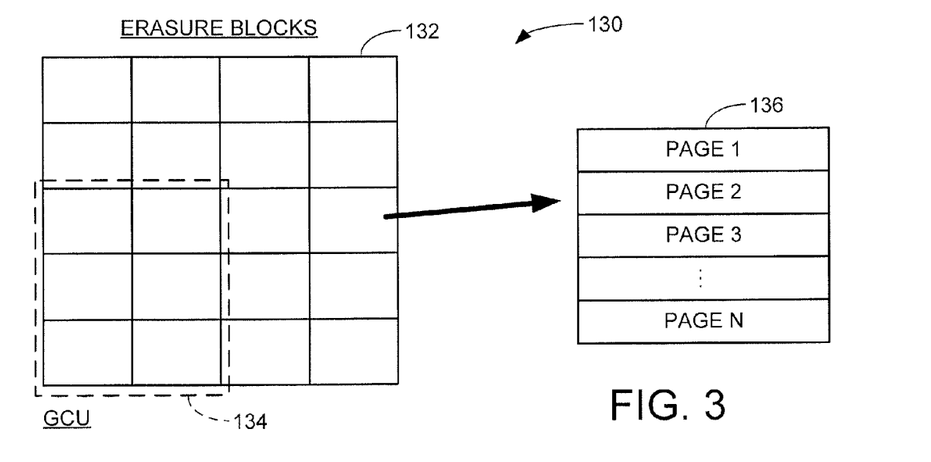
FIG. 3 shows an arrangement of the NAND flash memory from FIG. 2 into erasure blocks in accordance with some embodiments.

A portion of the flash array 122 is denoted in FIG. 3 at 130. The portion 130 shows a number of erasure blocks 132. Each erasure block 132 constitutes the smallest amount of the flash memory array 122 that can be erased at a time. As will be appreciated, flash memory and other erasable semiconductor memory structures generally allow data to be written once to a particular location, but cannot thereafter be overwritten with new data prior to an intervening erasure operation to erase the memory cells to return the cells to an initial (erased state).

New versions of an existing set of data (e.g., a particular logical block address, LBA) may be written to a new location within the array 122 each time the new version is presented for writing, and the older versions are marked as stale data pending erasure. Program/erase (PE) counts are often maintained to keep track of the total number of PE cycles that each location has received.

In some cases, groups of erasure blocks 132 may be grouped into a larger garbage collection unit (GCU) 134. GCUs may be allocated for service from an allocation pool. Once a GCU is filled with data that has become stale, the GCU may be subjected to a garbage collection operation to migrate currently valid data from the GCU to a new location, after which the erasure blocks in the GCU are erased, allowing the GCU to be returned to the allocation pool. In some cases, PE counts may be maintained on a GCU basis.

As further shown in FIG. 3, each erasure block 132 can be formed as a set of pages 136 of memory cells. Each page 136 stores a selected amount of user data, such as 4096 bits, 8192 bits, etc. A total number N of pages is shown in each erasure block. The value N can be any suitable number (e.g., 256, 512, etc.). Each successive page of memory is allocated at a time to fill a given erasure block. MLCs (multi-level cells) may store multiple pages across the same set (row) of memory cells.

Figure 4:
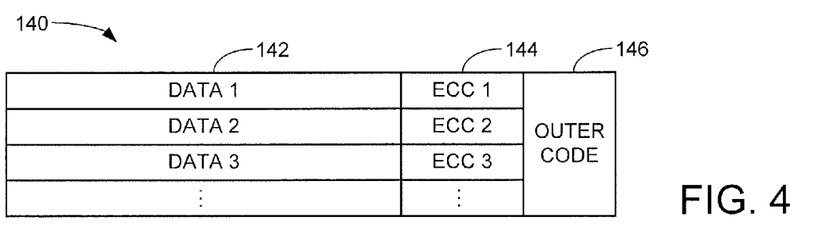
FIG. 4 illustrates an exemplary data format for data stored by the NAND flash memory in some embodiments.

FIG. 4 shows an exemplary data format 140 for data stored in erasure blocks such as 132 in FIG. 3. User data blocks 142, such as in the form of multi-byte code words, are encoded and written to each page 132. Each page may additionally store error correction code (ECC) values 144. The ECC values 144 are configured to allow the system to detect and correct up to a selected number of bit errors in the code words 142. In some cases, each page 132 includes separate locations to accommodate the code words 142 and the associated ECC values 144. The ECC values can take any number of forms such as Reed Solomon codes, BCH codes, etc.

In further embodiments, outer code values such as denoted at 146 can be used for multiple code words 142. The outer code values provide a second, higher level of parity protection for the data and ECC values. Thus, in cases where a total number of read errors in the data code words 142 cannot be resolved by the ECC values 144, the outer code values 146 can be employed to correct the remaining errors. The outer code values can take any suitable forms including a different strength of Reed Solomon codes, parity values, checksums, etc.

It is contemplated that the outer code values may be stored in the same erasure blocks 132 as the associated code words 142 and ECC values 144, or may be stored elsewhere in the system and used as required.

Figure 5:
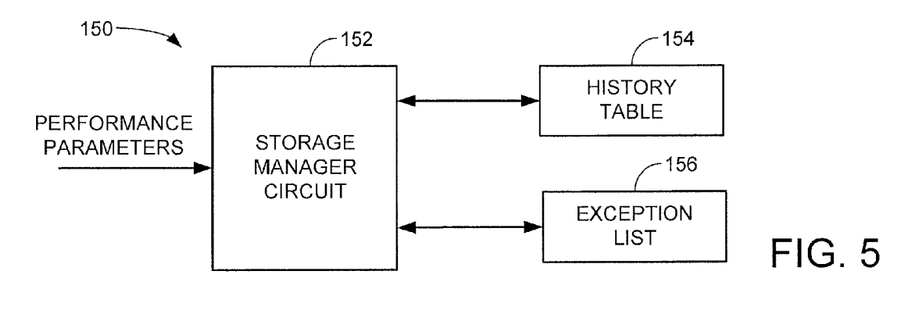
FIG. 5 is a functional block diagram of a storage manager circuit of the data storage device of FIG. 2 operative to manage the NAND flash memory in accordance with some embodiments.

FIG. 5 illustrates a data management control circuit 150 in accordance with various embodiments. The circuit 150 includes a storage manager circuit 152 and a number of data structures stored in associated memory locations, such as a history table 154 and an exception list 156. Other forms of control circuitry can be used as desired. It is contemplated although not necessarily required that the circuit 150 can form a portion of the functionality of the SSD controller 112 (FIG. 2), and the respective data structures 154, 156 can be stored in the local controller memory 114. Other arrangements can be used.

As explained below, the storage manager circuit 152 operates in the background during normal device operation to monitor and assess memory performance. Various performance parameters associated with the transfer of data between the array 122 and the host are monitored and accumulated. The storage manager circuit 152 periodically updates the history table 154 during such operation with various accumulated history statistics for each of a number of memory locations within the array. In some embodiments, history statistics are maintained on a per-page basis, although other granularities can be used including portions of pages, groups of pages, erasure blocks, groups of erasure blocks, GCUs, etc.

At appropriate times, the storage manager 152 evaluates the contents of the history table and generates corresponding entries in the exception list 156. Generally, the exception list constitutes an ongoing listing of the relatively worst performing locations in the memory. The system is adaptive and updated in real time or near real time.

Figure 6:
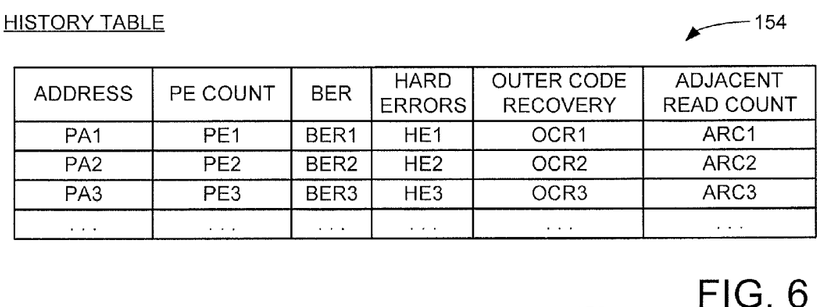
FIG. 6 is an exemplary format for a history table data structure maintained in a local memory by the storage manager circuit of FIG. 5.

An exemplary format for the history table 154 is provided in FIG. 6. A number of columns are denoted providing tabulated parametric values for different locations in the memory, including address, PE count, BER, hard errors, outer code recovery and adjacent read count. Each of these will be described briefly in turn. It will be appreciated that the format in FIG. 6 is merely to provide a concrete example and that other arrangements and forms of data can be used.

The address column denotes address, which in this case are the individual pages 136 within the memory 122 (see FIG. 3). As noted above, other granularities can be provided. It is contemplated that each separate memory location will have a corresponding entry (row) in the history table. Special flag bits or other values can be used for decommissioned locations that have been removed from service. Accordingly, each of the exemplary address values (PA1, PA2, PA3, etc.) correspond to a different unique physical address (PA) sufficient to identify individual pages (or other physical locations).

The PE count column provides accumulated PE (program/erase) counts for the corresponding address locations (pages). Wear leveling and overprovisioning techniques are envisioned, so it is contemplated that, while some pages may have relatively higher PE counts than others, overall, all of the PE counts will be maintained within a certain range as data writes are distributed uniformly throughout the memory array 122. It will be appreciated that the parameters listed in the history table are associated with the memory locations themselves, rather than being associated with particular data sets (e.g., particular LBAs). In other embodiments, data based parametrics can be incorporated into the history table as well (e.g., data aging, accumulated read counts per LBA, etc.).

As noted above, the memory may be specified with a certain PE maximum count that indicates an end of life (EOL) condition. The EOL condition may depend in part on the manner in which the memory is being used. For example, some NAND flash memories may be specified to accommodate 100,000 PE cycles if the flash memory cells are utilized as SLCs (single level cells), which store a single bit (0 or 1) in each cell. The same NAND flash memories may be specified to accommodate a much lower number, such as 5,000 to 10,000 PE cycles if the flash memory cells are utilized as MLCs (multi-level cells) in which multiple bits (e.g., 11, 10, 00, 01) are stored in each cell. Tracking the growth of the PE counts over time as the memory approaches the EOL specified value can trigger certain additional functions by the storage manager circuit 152, as discussed below.

The BER (bit error rate) column provides accumulated error rate performance values for the various memory locations (e.g., pages). BER can be measured in a variety of ways, but is generally defined as the total number of erroneous bits that are obtained during accumulated readback operations. BER values can vary, but typical BER values for a NAND flash memory may be in the order of from about $3\times10^{-6}$ to about $3\times10^{-7}$ errors per bit. These values are merely exemplary and may depend on a variety of factors including the use of SLC or MLC programming, the strength of the ECC and outercode, the actual data values stored in the memory, etc.

Multiple BER values may be maintained by the table, depending on the requirements of a given application. If page level granularity is used, multiple read operations may be employed and combined to arrive at a historical BER value suitable for that individual page. The BER can be raw (e.g., uncorrected real total number of readback errors obtained), or can be an ECC adjusted BER. A rolling average (e.g., the last X reads) or a total history value (all reads since inception of field use) can be used.

The next column, hard errors, indicates an accumulated count of how many so-called "hard errors" have been experienced by the associated location (e.g., page). Hard errors can be defined as requiring more effort than merely the on-the-fly application of the ECC code values (144, FIG. 4) during a given readback operation.

In some cases, SSDs such as 110 can employ a hierarchy of readback recovery efforts when an uncorrectable error is detected (e.g., an error that cannot be resolved immediately by the ECC values). Such efforts can include free retries (e.g., rereading the same data multiple times), adjustments in various voltage thresholds, application of other available ECC/outer code/parity values, etc. Each time that a read operation requires the use of one or more of these operations to recover the data, an increment can be made for the corresponding hard error count for that page. As before, this data can be maintained historically, so that the hard error values (e.g., HE1, HE2, HE3, etc.) represent integer values showing how many hard errors have been experienced per location (e.g., page) since field use was initiated. Other arrangements can be used, such as a rolling window (e.g., the total number of hard errors that occurred during the last 100 read attempts to that location, etc.).

The outer code recovery column indicates the associated total number of times that outer code was required to help resolve an uncorrectable error with the associated location. Similar to the hard error counts, the outer code recovery counts (OCR1, OCR2, OCR2, etc.) may be integer counts indicating how many times the outer code (e.g., 146, FIG. 4) was employed. It will be noted that, to the extent that the outer code covers multiple data sectors (e.g., code words 142 as in FIG. 4), the count value for each of the associated sectors might need to be updated regardless of where the error occurred. Still, the outer code recovery count can help pinpoint locations in the memory where excessive recovery efforts are required to recover the data, and may provide useful information when the time comes to decide which pages to retire from further service once EOL is reached.

Finally, the adjacent read count column provides a number of interest metrics (ARC1, ARC2, ARC3, etc.) relating to adjacent reads. A condition sometimes referred to as adjacent read disturb can affect data integrity in that, multiple reads to memory locations (e.g., pages) near a given page, such as in the same erasure block 132 (FIG. 3), can induce drift in the charge distributions maintained by the cells in that page.

Generally, read disturb effects tend to induce an increased rate of read errors in a given set of data, but due to disturbances of the data itself rather than degradation of the memory location. Stated another way, a large amount of adjacent reads may require certain data to be rewritten (either in place or to a new location in a garbage collection operation), but the read errors are attributable to operational conditions rather than a wear of the memory.

Hence, a given memory location (e.g., page) with a relatively high number of read errors, including hard errors and/or outer code recovery incidents, may not indicate a reduction in the efficacy of the memory location itself if the adjacent read count is sufficiently high as to indicate that the read errors may be attributable, at least in part, to excessive adjacent reads. Accordingly, the adjacent read count may be taken into account by the storage manager circuit 152 in selecting candidates for inclusion in the exception list 156, which will now be discussed as shown in FIG. 7.

Figure 7:
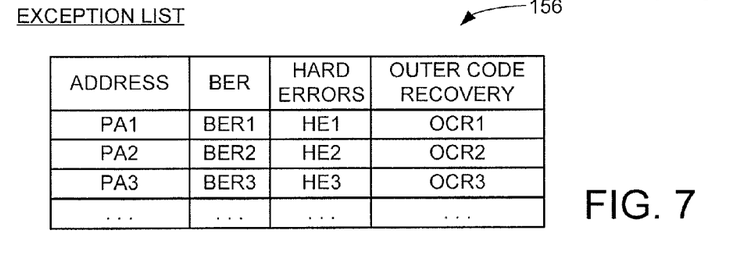
FIG. 7 is an exemplary format for an exception list data structure maintained in a local memory by the storage manager circuit of FIG. 5.

As before, the exception list format in FIG. 7 is merely exemplary and is not limiting. It is contemplated, albeit not required, that the exception list incorporates certain data fields from the history table that are ported over to the list. In other embodiments, other data parameters may be listed. In still other embodiments, a history table is not necessarily generated, but those memory locations (e.g., pages) exhibiting certain criteria (e.g., hard errors, outer code recovery efforts, etc.) are flagged for inclusion in the exception list.

Generally, it can be seen that the exception list as depicted in FIG. 7 provides address, BER, hard error and outer code recovery information for various locations (e.g., pages) PA-A, PA-B and PA-C. It is contemplated that the storage manager circuit 152 applies criteria to the various entries in the history table 154 (FIG. 6) and selects those entries having the "worst" performance to be added to the exception list 156.

The criteria used to select entries for inclusion in the exception list, and the rate at which such entries are added, can vary over time. Indeed, it is contemplated in at least some embodiments that the exception list will tend to be populated relatively slowly at initial stages of the operation of the device 110, and this will accelerate as the data in the history table becomes more definitive and mature, and the device itself gets closer to EOL status.

The total number of entry slots available in the exception list 156 can vary, but is contemplated as being a suitably large enough sample as to enable a reasonable identification of memory locations (e.g., pages) experiencing lower than average performance over time with respect to readback recovery. A suitable number of entries might be, for example, 4096 entries, 8192 entries, etc. The percentage of the total number of entries with respect to all memory locations (e.g., the size of the exception list 156 as compared to the size of the history table 154) can vary, and may range from less than 1% to a few percentage points.

As noted above, the storage manager circuit 152 operates to accumulate data for all locations in the history table 154, and periodically adds locations from the history table 154 to the exception list 156. In one example, the storage manager circuit 152 may select entries on the basis of overall BER, total number of hard errors, and/or total number of outer code recovery efforts, including combinations of the above as modified (as required) by excessive adjacent read counts.

Once added to the exception list, in some cases the associated location may be temporarily removed from further writes. An advantage of this approach is that, based on prior history, further storage to that location is at least suspended for a time. Because it is not always known, however, why a particular memory location may be experiencing an increased rate of read errors, in other embodiments the locations added to the exception list continue to be used in a normal fashion and the associated parametrics are updated in both the history table and in the exception list. This latter approach allows badly acting memory locations to become rehabilitated with the chance of being removed from the list based on improved behavior over time.

Figure 8:
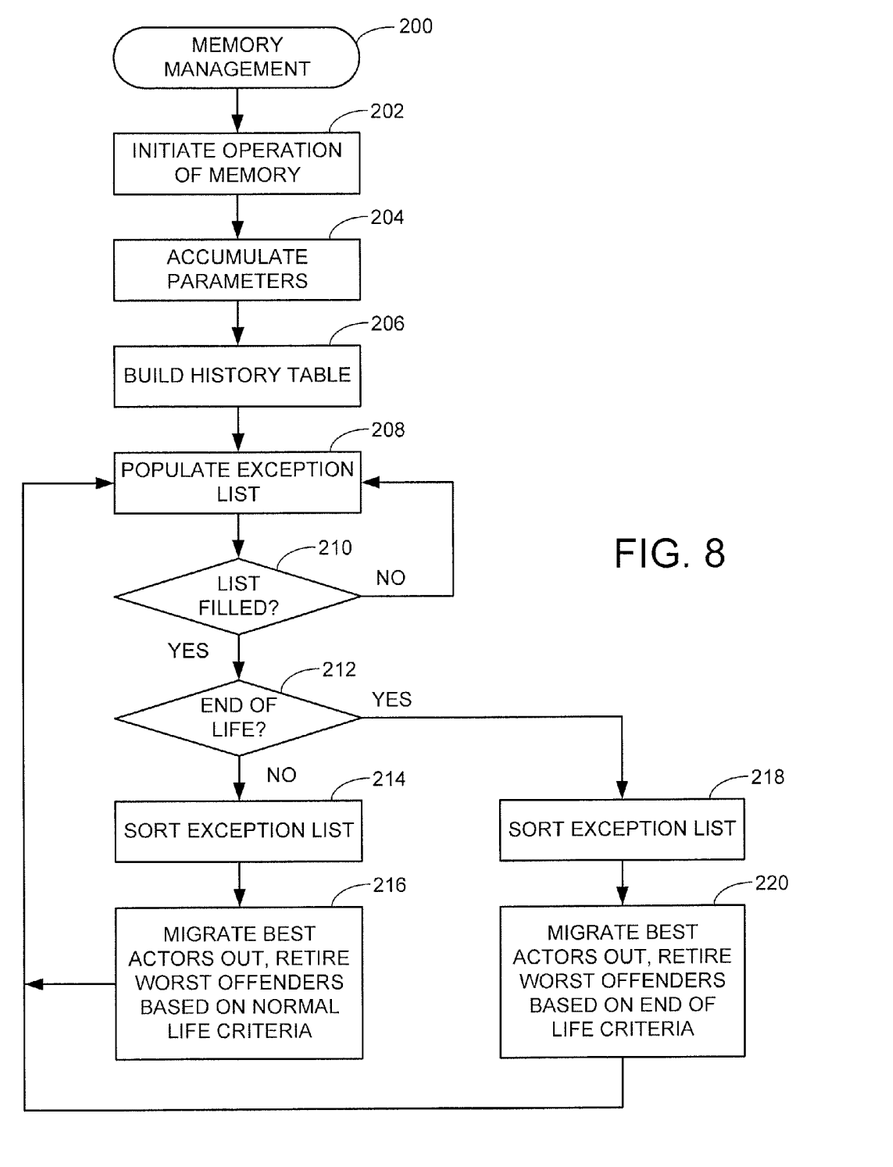
FIG. 8 is a flow chart for a memory management routine illustrative of steps carried out by the storage manager circuit of FIG. 5.

FIG. 8 provides a flow chart for a memory management routine 200 illustrative of steps carried out by the storage manager circuit 152 in accordance with some embodiments. It will be appreciated that the routine of FIG. 8 is merely exemplary and the various steps shown therein can be modified, omitted, appended, performed in a different order, etc. It is contemplated albeit not necessarily required that the processing depicted in FIG. 8 is carried out as a background operation over the life of the device, such as by programming instructions executed by the controller circuit 112 (FIG. 2). Various analysis operations may be delayed and performed at periods of low I/O host activity, etc.

Operation of the memory is initiated at step 202, which may commence when the storage device 110 is shipped and installed in a customer site. At this point, the device operates responsive to various access commands issued by a host to store and retrieve user data in the memory array 122. Various operations discussed above, such as wear leveling, garbage collection, etc. may be performed by the device in a conventional manner to provide reliable access to the stored data.

At step 204, various parameters are accumulated. These parameters can take a variety of forms, and may include the various parameters discussed above in FIGS. 5-7. As desired, the device may operate as shown by step 206 to build a history table for each utilized memory location (e.g., each page) in the memory to accumulate history parameter statistics. As noted above, a history table (such as 156 in FIGS. 5 and 7) can be particularly useful but is not necessarily required.

An exception list is populated at step 208. This is carried out as discussed above by noting particular memory locations (e.g., pages) that provide read performance that exceeds certain criteria. Experiencing or accumulating a certain number of hard errors, outer code recovery attempts, monitored BER values, etc. can be among the criteria used to select a candidate for inclusion in the exception list (154, FIGS. 5-6).

Decision step 210 determines whether the exception list has been filled. A total number of available entries is initially selected, such as 4096 or 8192 entries, and this value can be adjusted over time. Regardless, the exception list continues to be populated until it is filled, as shown by the path involving steps 208 and 210.

At such time that the list has been filled, the routine passes to step 212 where an inquiry can be made with regard to the overall aging of the memory, particularly, whether an end of life (EOL) condition is approaching or has been reached. The EOL status of the memory can be determined, for example, based on the existing PE counts for the various memory locations. It is contemplated that the list will tend to be filled long before the EOL condition is satisfied, although such is not necessarily required.

If the EOL condition has not yet been satisfied, the flow continues to step 214 where the exception list is sorted, based on one or more of the parameters in the list. For example, the various memory locations (e.g., pages) may be sorted by BER, total number of hard errors, total number of outer code recovery operations required to retrieve data, etc.

In some cases, a weighted metric that combines multiple ones of these or other parameters may be used to provide a ranking of the list, from worst performing page to best performing page.

Thereafter, as shown at step 216, those pages in the exception list exhibiting the best performance may, in some cases, be migrated out of the exception list and returned to service. The worst offenders, on the other hand, may be retired. Retirement may involve deallocation of the individual pages (or other memory locations) exhibiting the worst accumulated performance.

The manner and rate at which the various pages are either retired or returned to service (e.g., jettisoned from the exception list) can vary. So-called normal life criteria can be used during the normal life of the device, such that only particularly badly performing pages are removed based on the track record of having consistent and repeated difficulties in recovering data therefrom.

The actual criteria can vary depending on the requirements of a given application. IN some embodiments, the worst 10% (or some other value X %) of the pages may be automatically retired and the best 10% (or some other value Y %) of the pages may be automatically removed from the list. In other embodiments, specified criteria (e.g., a particular BER, hard error count, outer code recovery count, etc.) may serve as a threshold so that those pages exceeding such threshold(s) are retired. It is contemplated that the criteria may be adjusted over time, so that as the device approaches EOL condition, the criteria may be either relaxed or tightened as needed to maintain certain overall specified performance levels (including data capacity, I/O rates, BER rates, etc.).

The routine passes from step 216 back to step 208 where the exception list is now repopulated to add new entries, as required, to fill out the empty entries vacated by such retirement and/or jettisoning from the list. It is contemplated that using an exception list in this manner allows the storage manager circuit 152 (FIG. 5) to periodically assess the recent history of the memory and make decisions, as necessary, to retire or rehabilitate various locations.

Continuing with the flow of FIG. 8, at such time that the memory reaches EOL conditions, the flow passes from step 212 to step 218, where once again the exception list is sorted. The criteria for ranking the entries in the exception list at this point may be the same as was used in step 214, or different criteria may be utilized. Regardless, the sorting operation at step 218 operates to provide a ranking of the pages (or other memory locations) from worst performing to best performing (within the list). This allows the storage manager 152 to operate at step 220 to migrate the best performing pages from the list back into normal service and to remove from service the worst performing pages, using suitable end of life (EOL) criteria.

The EOL criteria used at step 220 may be the same as, or different from, the normal life criteria of step 216. It is noted that end of life criteria may focus more on observed BER rates, indicative of wear of the locations, and will provide a better indication of the actual state of the memory. Those locations exhibiting poor read performance, such as by an inability to retain the accumulated charge, can be retired from further service, allowing other memory locations which still operate in an acceptable manner, to be used for the storage of user data long after the EOL condition has been reached.

Although not shown in FIG. 8, additional operations can be carried out as well, such as an indication to the host device of the percentage (or numbers) of memory locations that have been retired from service due to poor performance. This can enable a user of the host system to judge system operation and take steps, as necessary, to replace the storage device at an appropriate time. At the same time, the retiring of the worst performing memory locations, which will continue past the EOL condition being met, will allow the storage device to continue to reliably store and retrieve user data.

Figure 9:
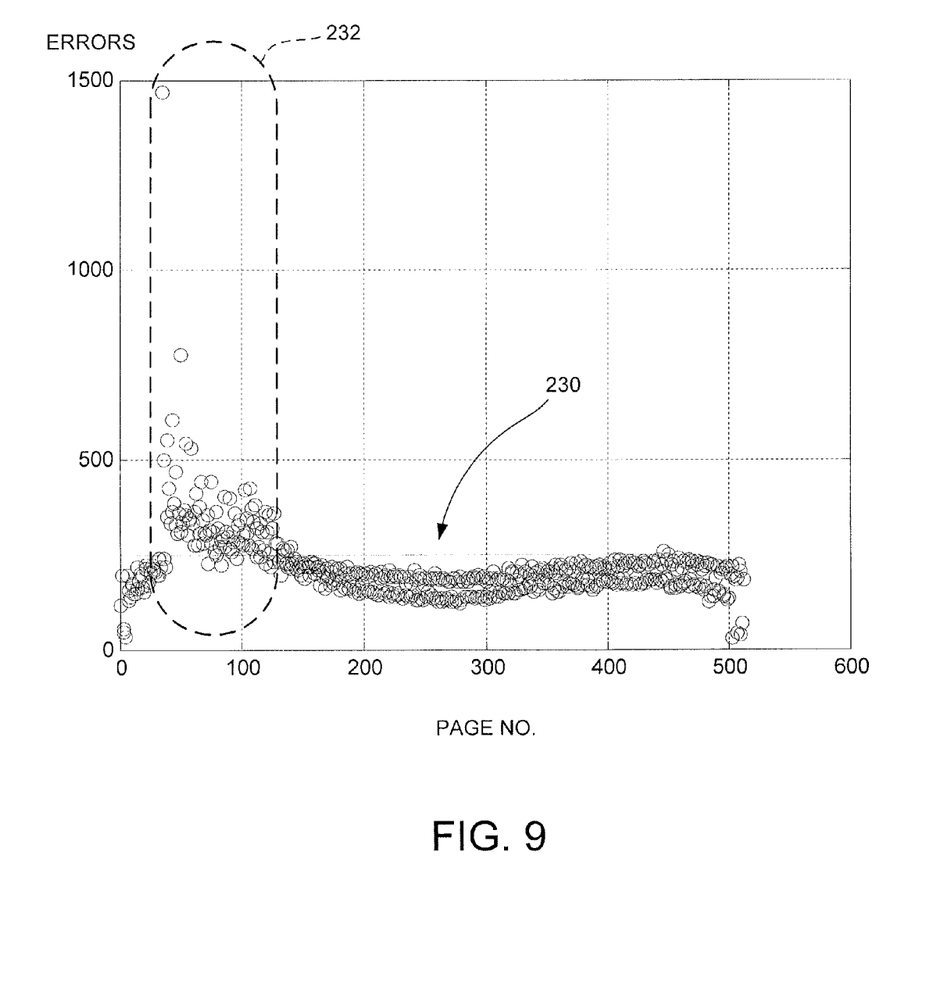
FIG. 9 is a graphical representation of empirical data obtained from an exemplary memory illustrating disparities in error rate performance for different memory locations.

FIG. 9 provides a graphical representation of read bit error rate (RBER) data 230 for a collection of memory locations (e.g., pages) in an exemplary device that has achieved EOL conditions. The data are represented against an x-axis indicative of different page addresses and a y-axis indicative of total accumulated read errors over a selected period.

As can be seen from FIG. 9, a majority of the pages exhibit reasonably controlled error performance values (e.g., less than about 250 errors on the graph). A segment of the pages generally identified at 232, however, exhibit localized higher numbers of error values (e.g., from around 250 errors to upwards of about 1500 errors). These pages represent about 0.042% of all of the pages in the memory. By retiring this relatively small percentage of badly performing pages using the routine of FIG. 8, the overall read performance the memory can be significantly improved.

Figure 10:
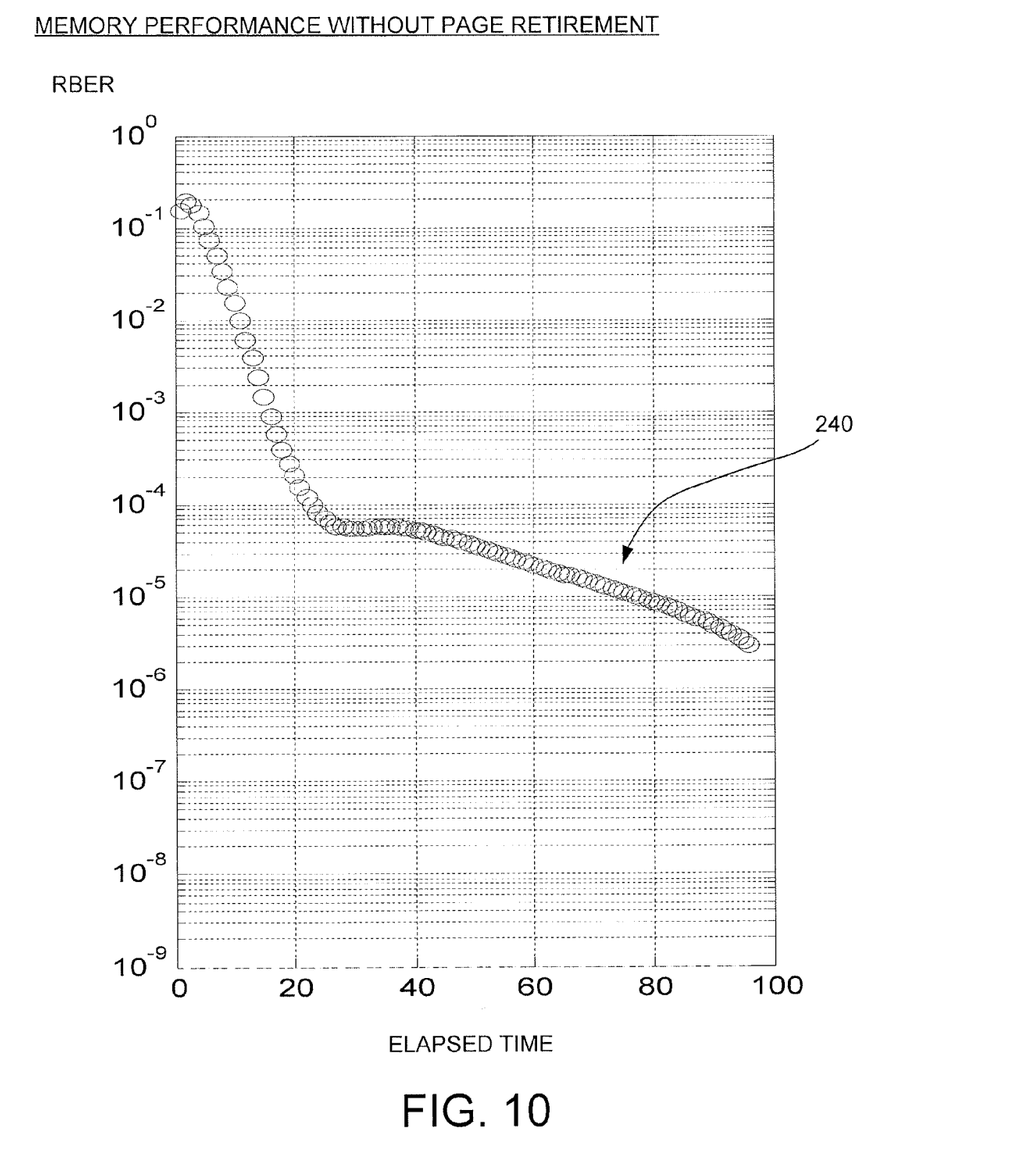
FIG. 10 is a graphical representation of empirical data obtained from an exemplary memory showing bit error rate performance with respect to aging without the use of the routine of FIG. 8.

FIG. 10 provides a graphical representation of error rate performance data 240 with respect to normalized elapsed time for a memory that does not have page retirement as set forth by FIG. 8. The continued degradation near end of life can provide unacceptable levels of I/O performance.

Figure 11:
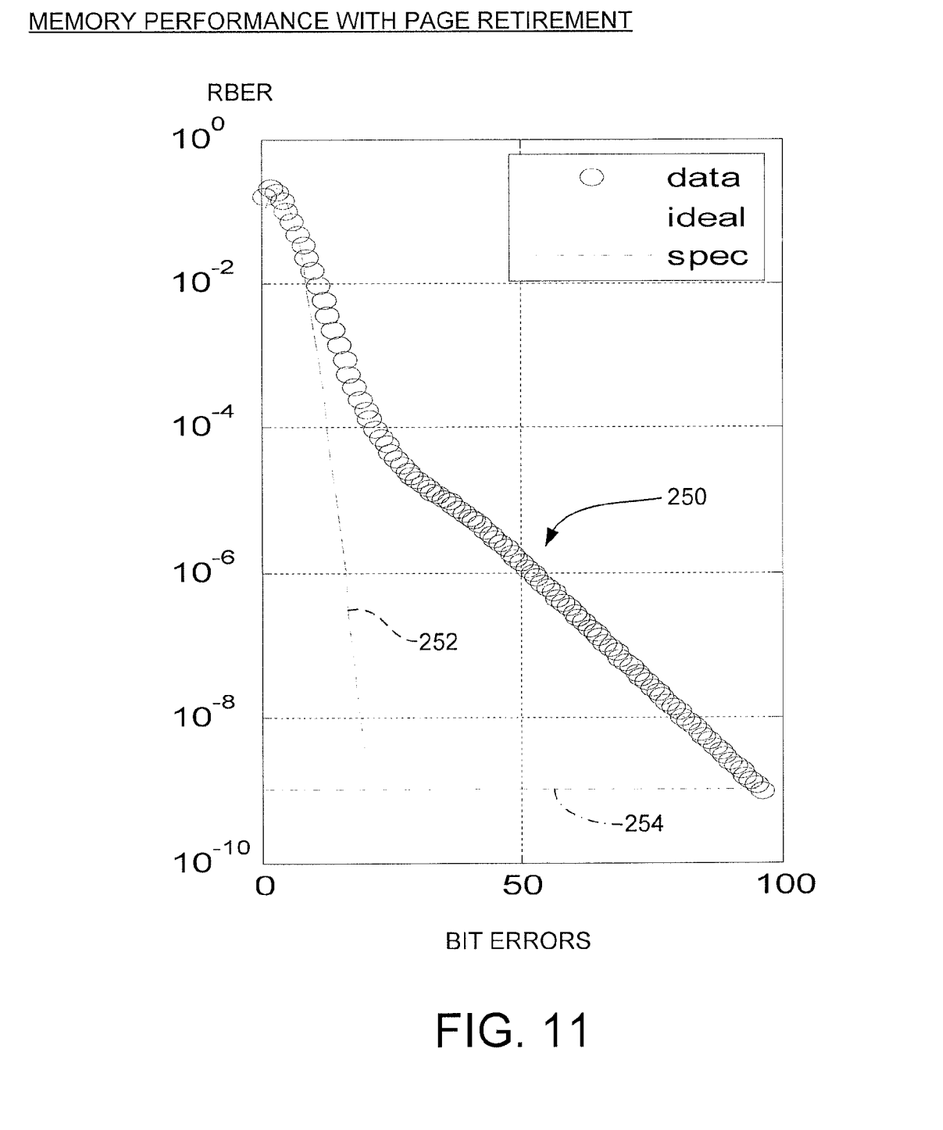
FIG. 11 is a graphical representation of empirical data obtained from an exemplary memory showing improvements in bit error rate performance with the use of the routine of FIG. 8.

FIG. 11 is a graphical representation of error rate performance data 250 for a device that has undergone page retirement in accordance with FIG. 8. In FIG. 11, the horizontal dot-dash line 252 represents the required specified BER performance for the device, and the downwardly depending dashed line 254 shows an ideal degradation path. The actual data 250 does reach the specified rate line 252, but the time that the device can continue to operate within this specification is extended using the page retirement methodology.

While various embodiments have been discussed above in the context of erasable NAND flash memory, such is merely for purposes of illustration and is not limiting. Other forms of erasable memory that require an erase operation prior to writing a new set of data thereto can be utilized, including but not limited to NOR flash memory, etc. Additionally, rewritable solid-state semiconductor non-volatile memory (NVM) such as STRAM, RRAM, MRAM, PCRAM, etc. in which a new set of data can be overwritten in place on an existing set of data without an intervening erase operation can also be used.

For purposes of the appended claims, reference to an erase count and the like will be understood consistent with the foregoing description to correspond to a total number of times that data have been programmed to an associated location. Thus for erasable memories, the count may indicate total PE counts. For rewritable memories, the count may indicate total programming counts in which new data have been overwritten onto previously written data.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A storage device, comprising:
a solid state non-volatile memory (NVM) having a plurality of memory locations, each memory location configured to store a user data code word and a first level error correction code (ECC) configured to detect and correct up to selected numbers of errors in the user data code word during a read operation, the NVM further configured to store a second level ECC configured as outer code to detect and correct at least one additional error in a user data code word not correctable by the first level ECC; and
a control circuit configured to transfer user data between the NVM and a host device, the user data processed by the control circuit to form one or more of the user data code words, the control circuit configured to maintain, in a local memory, a data structure indicative of measured readback error rates associated with memory locations in the NVM in relation to erasure counts associated with the memory locations, the measured readback error rates comprising a total count of read operations on the memory locations that required the use of the second level ECC to correct at least one read error, the control circuit further configured to retire a subset of the memory locations identified by the data structure from further availability to store user data from the host device responsive to the measured readback error rates and responsive to the erasure counts of the memory locations indicating the NVM has reached an end of life (EOL) condition.

2. The storage device of claim 1, wherein the NVM is a flash memory arranged as a sequence of erasure blocks each individually erasable by the control circuit, each erasure block is arranged as a plurality of pages to store data that are programmed and read as a unit, and each memory location corresponds to a selected page in the flash memory.

3. The storage device of claim 1, wherein the NVM is a rewritable non-volatile memory and the erasure count corresponds to a total number of times that data have been overwritten onto an existing set of data in the memory location associated with the erasure count.

4. The storage device of claim 1, wherein the measured readback error rates comprise an accumulated bit error rate indicative of a rate at which uncorrected read errors are detected during access operations associated with the memory locations.

5. The storage device of claim 1, wherein the control circuit is configured to perform a hierarchy of read recovery operations responsive to a hard error obtained during a selected read operation upon a selected memory location, and the measured read error rates comprise a total accumulated count of said hard errors associated with the selected memory location.

6. The storage device of claim 1, wherein the NVM has a total number of N memory locations available to store the user data transferred between the NVM and the host device, and the data structure is characterized as an exception list that accommodates up to a maximum number M entries less than N to identify selected memory locations with a worse than average read performance.

7. The storage device of claim 1, wherein the control circuit operates to direct writing of new data to the memory locations identified by the data structure.

8. The storage device of claim 1, wherein the control circuit temporarily restricts writing of new data to the memory locations identified by the data structure so long as the memory locations remain on the exception list.

9. The storage device of claim 6, wherein the control circuit further maintains a second data structure in the local memory characterized as a history table, the history table having a total of N entries with each entry corresponding to a different one of the memory locations in the NVM and storing accumulated read error performance parameters for the memory location associated with each entry.

10. The storage device of claim 1, wherein the NVM has a specified end of life (EOL) specification indicating a total number of erasure counts that can be applied to each memory location, wherein the data structure maintains the erasure counts for each of the memory locations, and wherein the control circuit retires less than all of the memory locations listed in the data structure responsive to the erasure counts reaching the EOL specification.

11. A solid-state drive (SSD), comprising:
a NAND flash memory array comprising non-volatile flash memory cells arranged into erasure blocks, each erasure block having a plurality of pages for storage of user data;
a read/write/erase (R/W/E) circuit configured to respectively program data to the pages during a write operation, read previously programmed data from the pages during a read operation, and erase the erasure blocks during an erasure operation;
a local volatile memory; and
a control circuit configured to populate, in the local volatile memory, an exception list data structure comprising readback error rates associated with selected pages in the NAND flash memory array that exhibit degraded read performance during said read operations, the control circuit further configured to retire a first subset of the pages listed in the exception list data structure from further availability to store any of the user data from a host device responsive to the readback error rates of the first subset and responsive to associated erasure counts for the first subset indicating a total number of erasure operations exceeding a specified end of life (EOL) condition for the NAND flash memory array, the control circuit further configured to concurrently remove a second subset of the pages from the exception list data structure to rehabilitate the second subset for continued storage of user data from the host device responsive to the retiring of the first subset, the pages in the second subset exhibiting better read performance as compared to the pages in the first subset.

12. The SSD of claim 11, wherein the readback error rates comprise an accumulated bit error rate indicative of a rate at which uncorrected read errors are detected during access operations associated with the pages during said read operations.

13. The SSD of claim 11, wherein each page is configured to store a user data code word and a first level error correction code (ECC) configured to detect and correct up to selected numbers of errors in the data code word during a selected read operation, the NAND flash memory array further stores an outer code comprising a second level ECC configured to detect and correct at least one additional error in the data code word not correctable by the first level ECC during the selected read operation, and the readback error rates comprise a total count of read operations on the associated pages that required the use of the second level ECC to correct at least one read error.

14. The SSD of claim 11, wherein the control circuit is further configured to sort the exception list data structure in a sequential order that lists the pages in the exception list data structure from a best performing page having the best read performance to the worst performing page having the worst read performance, the first subset comprising a first selected percentage of adjacent pages in the sequential order, the second subset comprising a second selected percentage of adjacent pages in the sequential order.

15. A method comprising:
storing user data to, and retrieving user data from, memory locations of a solid-state non-volatile memory (NVM), the user data supplied by a host device;
populating an exception list data structure in a local memory comprising a plurality of entries, each entry corresponding to a different one of the memory locations and comprising a measured read error rate for the associated memory location;
monitoring an erasure count as a total number of erase operations applied to a selected memory location; and
retiring a first subset of the memory locations in the exception list data structure from further availability to store any user data subsequently supplied by the host device responsive to the exception list data structure reaching a maximum number of entries, responsive to the erasure count reaching an end of life (EOL) specification for the (NVM), and responsive to the first subset of the memory locations in the exception list having a measured read error rate that exceeds a predetermined threshold.

16. The method of claim 15, wherein the first subset of the memory locations in the exception list data structure exhibit relatively worse measured read error rates as compared to remaining memory locations on the exception list, and wherein the method further comprises concurrently removing a second subset of the memory locations from the exception list that exhibit relatively better measured read error rates as compared to remaining memory locations on the exception list.

17. The method of claim 15, wherein the step of populating the exception list data structure comprises selecting memory locations for inclusion in the exception list data structure responsive to the measured read error rate for each selected memory location exceeding a predetermined read error rate threshold.

18. The method of claim 15, further comprising maintaining a history table data structure in the local memory which stores the measured read error rate for each of the memory locations in the NVM and selecting a portion of the memory locations less than all of the memory locations in the NVM for inclusion in the exception list data structure.

19. The SSD of claim 11, wherein the control circuit is further configured to sort the exception list data structure in a sequential order that lists the pages in the exception list data structure from a best performing page having the best read performance to the worst performing page having the worst read performance, the first subset comprising a first selected percentage of adjacent pages in the sequential order, the second subset comprising a second selected percentage of adjacent pages in the sequential order.

20. The method of claim 15, further comprising:
sorting the exception list data structure in a sequential order that lists the pages in the exception list data structure from a best performing page having the best read performance to the worst performing page having the worst read performance, the first subset comprising a first selected percentage of adjacent pages in the sequential order having a relatively worse read performance; and removing a second subset of the pages from the exception list data structure to rehabilitate the second subset for continued storage of user data from the host device responsive to the retiring of the first subset, the second subset comprising a second selected percentage of adjacent pages in the sequential order having a relatively better read performance.

* * * * *